United States Patent [19]

Sawa et al.

[11] Patent Number: 5,139,636

[45] Date of Patent: Aug. 18, 1992

[54] PROCESS FOR ELECTROPLATING AND APPARATUS THEREFOR

[76] Inventors: Hironari Sawa, 11-19, Inokashira 1-chome; Kazunari Sawa, 26-8, Inokashira 2-chome, both of Mitaka City, Tokyo; Norinari Sawa, 15-10-403, Ohizumigakuenmachi 4-chome, Nerima-ku, Tokyo, all of Japan

[21] Appl. No.: 588,166

[22] Filed: Sep. 26, 1990

[30] Foreign Application Priority Data

Sep. 29, 1989 [JP] Japan ................... 1-252093

[51] Int. Cl.⁵ .................... C25D 17/00; C25D 21/10
[52] U.S. Cl. ................................ 204/273; 204/277; 205/291
[58] Field of Search ................ 204/273, 277, 52.1, 204/44; 205/239, 291

[56] References Cited

U.S. PATENT DOCUMENTS

| | | | |
|---|---|---|---|
| 3,630,860 | 12/1971 | Fox | 204/277 |
| 3,959,112 | 5/1976 | Arend, Jr. | 204/273 |
| 4,141,804 | 2/1979 | Avedesian et al. | 204/277 |
| 4,263,120 | 4/1981 | Berndt et al. | 204/273 |

Primary Examiner—John Niebling
Assistant Examiner—Brian M. Bolam

[57] ABSTRACT

Process for electroplating and apparatus therefor characterized by guiding just released bubbles to rise up symmetrically between the substrate plate and each of the anode plates so as to cause stable rising currents; providing a pair of passages outside of the bath so as to receive the bath solution overflowing above the upper edges of the bath wall to be jointed with the respective rising currents near the bath bottom; and preventing the descending and turning currents from disturbing just released bubbles near the joint positions of the descending and rising currents.

5 Claims, 5 Drawing Sheets

PROCESS FOR ELECTROPLATING AND APPARATUS THEREFOR

FIELD OF THE INVENTION

The invention relates to a process and apparatus for electroplating a substrate with a metallic material, above all with copper, and more particularly to an improvement of the system in which air bubbles are used for causing rising currents and stirring electroplating solution.

BACKGROUND OF THE INVENTION AND RELATED ART

Recently there are increased demands for more uniform electroplating, above all in the electronics industry. For instance, the printed-circuit board has a width of the conductor and a gap between the neighbouring conductors far less than 100 μm in order to attain higher integration density.

In order to comply with such demands, it is necessary to lower a metal ion concentration in the electroplating solution and consequently a cathode current density so as to form smaller matallic crystals.

As well known by those skilled in the art, when the concentration of copper sulfate is in the range of 60–120 g/l, the cathode current density ranges from about 1A/dm$^2$ to about 3A/dm$^2$.

If the concentration is lowered down to the lower limit, 60 g/l for the purpose referred to above, the current density necessary for preferable electroplating is to be in the range of 1–1.5A/dm$^2$ according to experiences by the inventors, which means that it takes so much time for electroplating in a desired thickness e.g. 25–30 μm.

It has been well known that when the electroplating bath is relevantly stirred it is possible to increase the cathode current density by two or three times, and consequently it has been proposed and actually used to utilize air bubbles for causing rising currents and stirring of the solution, which will be explained in reference to FIGS. 5–8 so that the problems of the technical standard of this technical field may be readily understood.

In an electroplating bath 11 substantially of rectangular parallelepiped, which is fully filled with an aqueous copper sulfate solution 12, there are arranged a substrate 21 to be vertically held as a chatode plate and a pair of anode plates 22, 22' also held vertically so as to put the substrate 21 therebetween with respectively leaving a substantially same distance. There is mounted a bubble box 13 at the bottom of the bath.

The bubble box 13 extending along the bath side wall and shown in FIG. 5 is formed with two rows of nozzles 13a, 13a' (see also FIG. 8) in the upper wall thereof so as to release bubbles which may rise up in the solution along the both sides of the substrate 21, whereby a pair of convection currents shown by arrows are formed. Owing to rising currents, the level of the solution is swelled up above the substrate as more or less exaggeratedly shown by phantom lines.

In order to realize homogeneous and symmetrical electroplating of copper on the both sides of the substrate, it is necessary to keep the smooth and stable convection currents of the bath solution, which are obviously formed on a balance of various factors.

When the balance is once lost even a little, for instance the convection current around the right anode plate 22' (FIG. 6) is made stronger, the courrent descending along the outer side of the anode plate 22' down to the lower edge thereof and just rising up along the inner side thereof is apt to push bubbles just released from the right nozzles 13a' towards the left so that stirring of the solution at the right side of the substrate 21 as the cathode plate is weakend whereby the so-called burnt deposit is caused on the corresponding surface thereof.

When such state is kept for a while the liquid pressure is increased relative to that in the right side, which makes the left convection current to be stronger relative to the right one so as to cause burnt deposit on the left side surface of the substrate. The repetition of the above ca not enusure relevant electroplating.

Now in reference to FIG. 8 which is a section of the bath 11 taken along a line VIII—VIII in FIG. 7 so as to show only one side, i.e. the left side of the substrate 21 in FIG. 7 as in a side elevation, bubbles released through the nozzle or nozzles 13a formed in the middle portion along the box rise up in the solution without being influenced by the inner surfaces of the side walls of the bath 11 and with pulling bubbles released through the outer holes 13a so as to form a more strongly rising current which may make the solution level to be swelled up at the center as shown by phantom lines.

The rising current is then divided to flow leftwards and rightwards and further to form two descending currents as shown by arrows. Since there are little or no bubbles at the left and right portions in the solution as shown in FIG. 8, burnt deposits may be formed on the substrate near the left and right edges thereof.

SUMMARY OF THE INVENTION

An object of the invention is, thus, to provide a process and an apparatus for electroplating a substrate at the both sides thereof with a matallic material, above all with copper so as to form a uniform thickness of the copper layer without forming burnt deposits owing to stable and uniform stirring of the electroplating solution and consequently owing to possibility of giving higher cathode current density.

DESCRIPTION OF THE INVENTION

Now in reference to FIGS. 1 and 2, an embodiment of the apparatus according to the invention will be explained hereafter.

Figure 1:
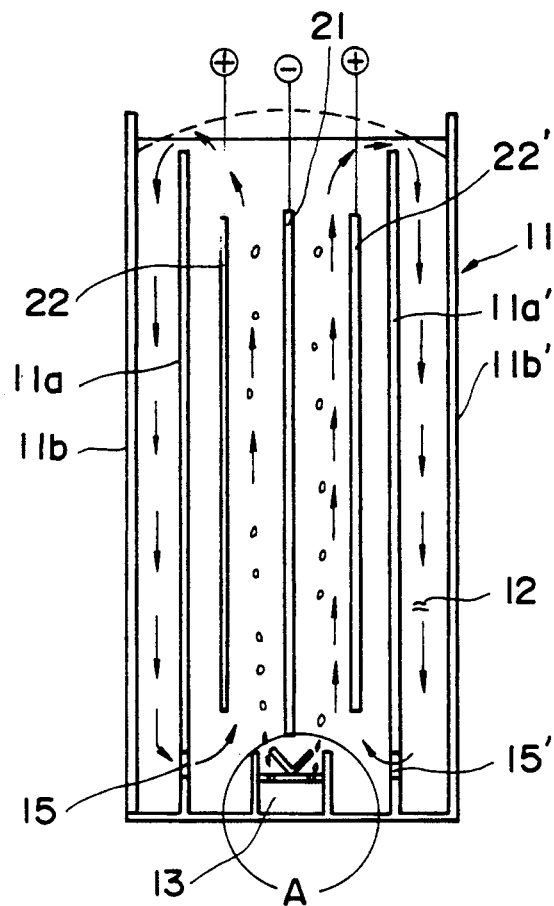
FIG. 1 is a sketch of the electroplating apparatus according to the invention shown in a longitudinal section.
Figure 5:
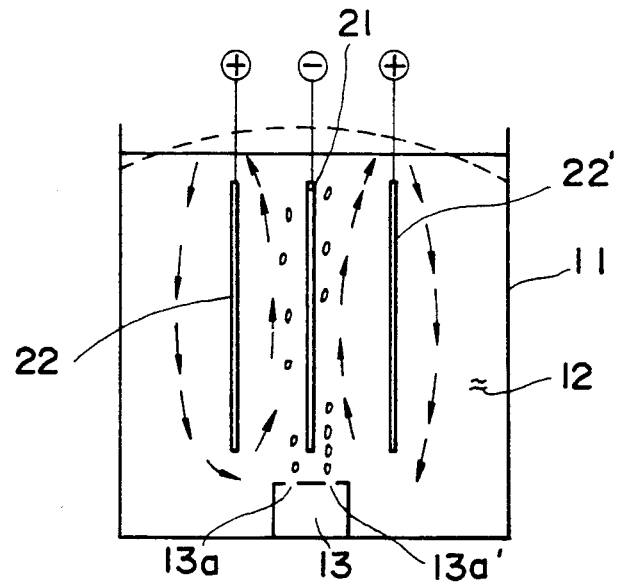
Figure 6:
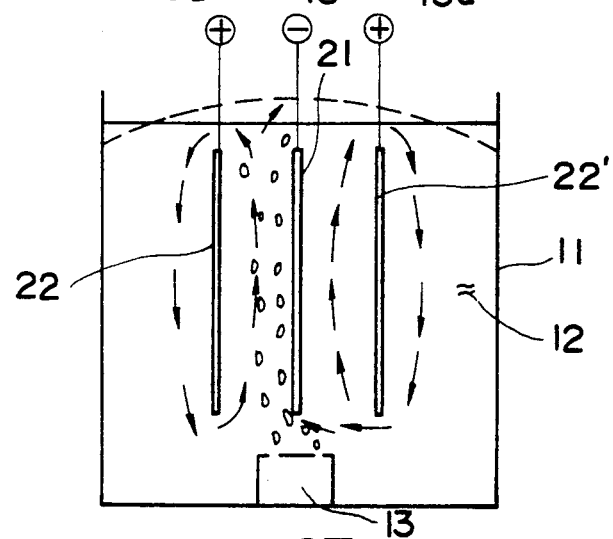
Figure 7:
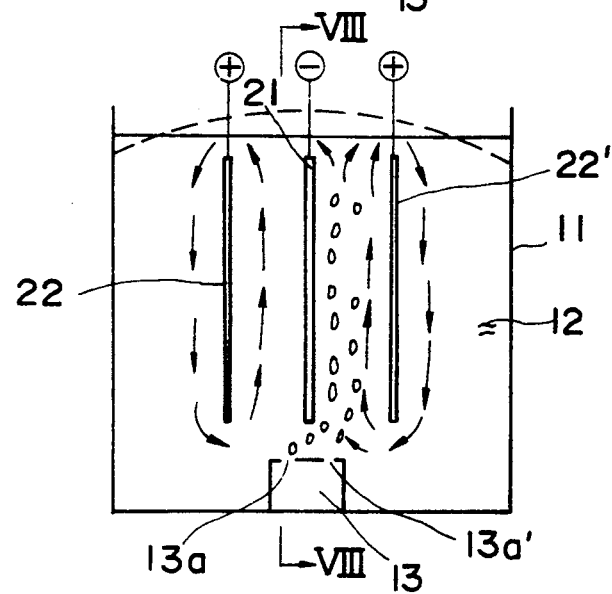
Figure 8:
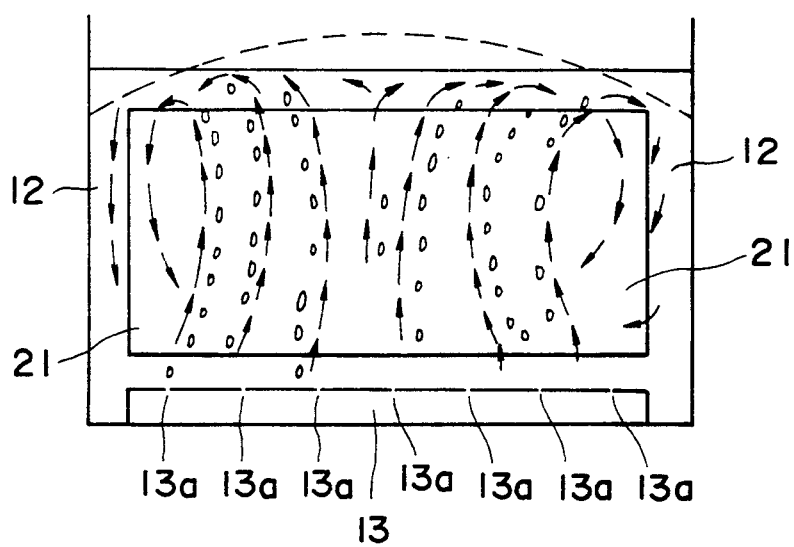
FIG. 8 is a sketch of the above shown in a section taken along a line VIII—VIII in FIG. 7.

In the electroplating bath, which is similarly filled with electroplating solution 12, as seen from FIG. 1, there are also arranged the substrate 21 as the cathode plate, the pair of anode plates 22, 22' held so as to put the substrate therebetween respectively with leaving the same distance, and the bubble box 13 having the nozzles 13a, 13a' formed in the upper wall thereof and mounted on the wall of the bath, in the manner the prior art shown in FIG. 5.

The box 13 extending along the bath side walls is fed with compressed air so as to rise up in the solution through nozzles 13a, 13a' to form bubbles. Strongly rising up bubbles make the solution level to be swelled up at the center as shown by phantom lines and form a pair of rising currents, which respectively then turn near the level and descend down to form two convection currents for stirring the solution.

Figure 2:
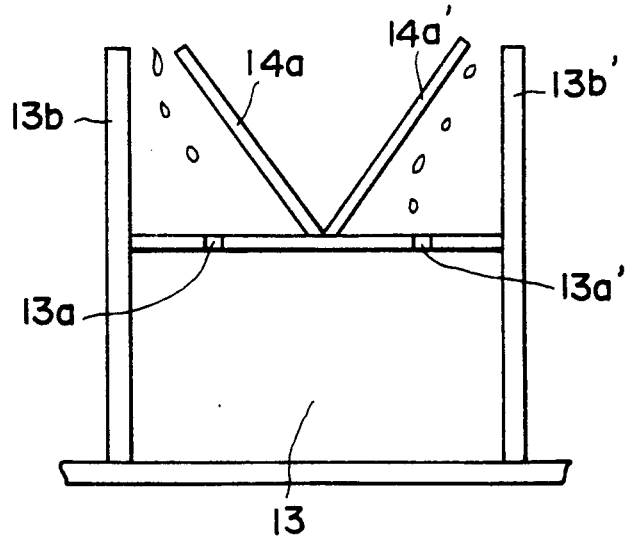
FIG. 2 is a sketch of the portion circled A in FIG. 1 shown in an enlarged scale.

According to the invention, the bubble box 13 is mounted with a pair of slanted plates 14a, 14a' extending therealong as best shown in FIG. 2 which shows a portion encircled A of the apparatus in FIG. 1 so as to guide air bubbles for stably rising up in the solution between the cathode plate 21 to be coated with metal such as copper and each of the anode plates 22, 22', and consequently form a pair of stable rising currents therebetween. Of course an angle of the plate inclination is not theoretically critical but a matter of design, which is to be varried depending on various factors.

According to the embodiment of the invention, the side walls of the electroplating bath consist of inner ones 11a, 11a' and outer ones 11b, 11b' symmetrically arranged in respect of the substrate 21 so that each of the descending currents may move down between the inner and outer walls 11a, 11b (11a', 11b'). For that purpose the inner wall 11a (11a') must have the upper edge a little below the solution level so that the rising current may go over the upper edge referred to above to descend for forming the smooth convection current. For a similar purpose, the inner wall 11a (11a') must have an opening 15 (15') near the lower edge thereof for the descending current to pass therethrough to rise up and pass again between the anode plate 22 (22') and the cathode plate 21.

In order that currents having passed through the opening 15, (15') should not disturb bubbles just released, it is preferable to provide a pair of upwardly protruded plate members 13b,13b', for instance by extending side walls of the bubble box 13, respectively in the vicinity of the openings 15, 15'. The upwardly protruded plate members 13b, 13b' may serve also to more relevantly guide bubbles just released in cooperation with the concerned slanted plates 14a, 14a'.

Figure 3:
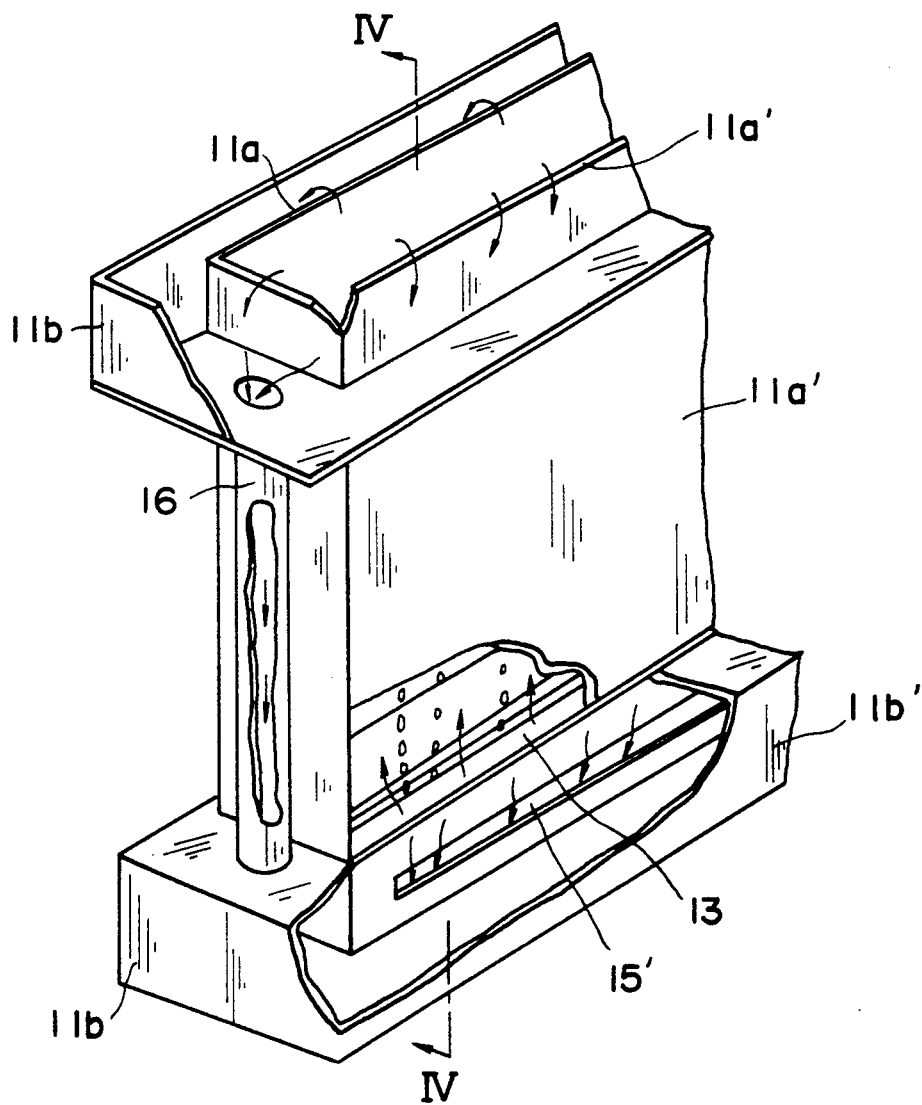
FIG. 3 is a perspective view of a portion of the apparatus of the invention partly cut off for showing bubbles and currents in the solution.
Figure 4:
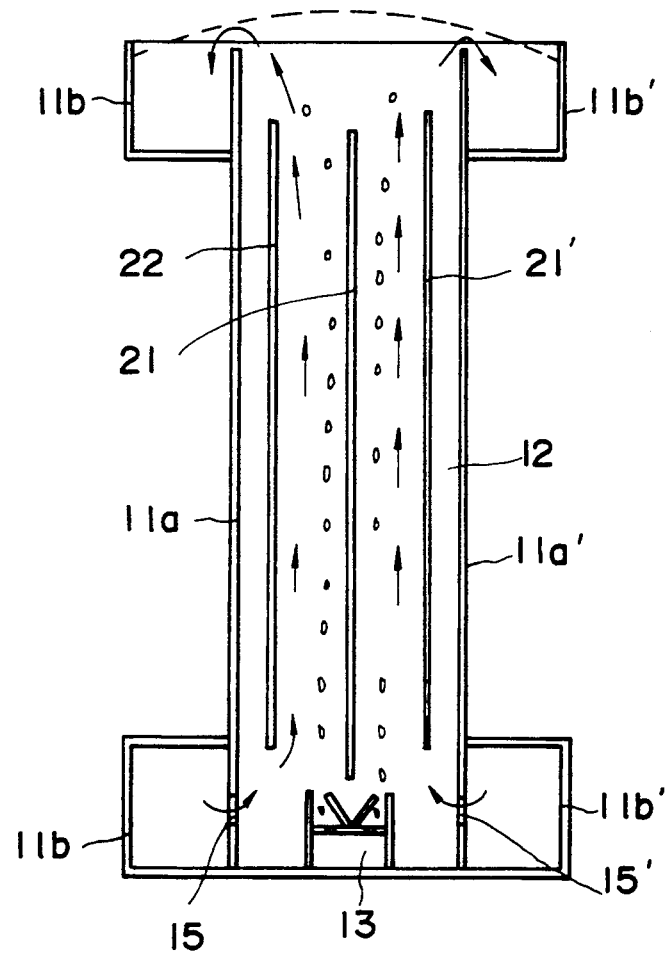
FIG. 4 is a sketch of another embodiment according to the apparatus of the invention shown in a longitudinal section taken along a line IV—IV in FIG. 3, FIG. 5–7 are views similar to FIG. 1 but for showing the apparatus of the prior art.

FIG. 3 and FIG. 4 which is a sectional view taken along a line IV—IV in FIG. 3, show another embodiment of the invention, in which the outer side walls 11b, (11b') are abolished, and instead an upper vessel having inner side walls 11a, 11a' and outer side walls 11b, 11b' and a lower vessel having also inner side walls 11a, 11a' and outer side walls 11b, 11b'. The two vessels are connected together with a pair of vertical ducts 16, so that the rising current may pass through similarly between the cathode plate 21 and the anode plate 22, (22') (see FIG. 4) but the descending current passes through the vertical duct 16 (see FIG. 3) and turn to pass through an opening 15, (15') similarly formed in the inner wall 11b (11b') near the lower edge thereof.

Essential features of the process according to the invention lies, thus, in guiding just released bubbles to rise up symmetrically between the substrate plate and each of the anode plates so as to cause stable rising currents; providing a pair of passages outside of the bath so as to receive the bath solution overflowing above the upper edges of the bath wall to be joined with the respective rising currents near the bath bottom; and preventing the descending and turning currents from disturbing just released bubbles near the joint positions of the descending and rising currents.

The process according to the invention was carried out with using the apparatus of the invention as shown in FIGS. 3 and 4.

The apparatus was of 1200 mm length, 250 mm width and 800 mm height, which was amounted with the upper and lower vessels as shown in FIGS. 3 and 4, which was filled with an aqneous solution of 60 g/l copper sulfate, 200 g/l sulfuric acid and 5 g/l usual additives at a temperature of 280° C. A substrate of 330 mm × 300 mm × 1.6 mm was electroplated with a cathode current density of 5A/dm$^2$ for 30 minutes to form a deposited copper layer having an average thickness of 28.6 μm with differential thickness of 1.35 μm.

Then the electroplating was carried out with a cathode current density of 7.5A/dm$^2$ for 23 minutes to form a deposited layer having an average thickness of 30.93 μm with differential thickness of 1.91 μm.

Furthermore the electroplating was carried out with a cathode current density of 10A/dm$^2$ for 15 minutes to form a deposited layer having an average thckness of 28.02 μm with a differential thickness of 1.89 μm.

There was observed no burnt deposit throughout said three tests.

In consideration of that differences of the thickest and thinnest portions of 1.35 μm, 1.91 μm and 1.89 μm are far smaller than 10 μm or more differential thickness inevitable according to the prior art, the improvement attained by the invention is to be well appreciated by those skilled in the art.

What is claimed is:

1. An apparatus for electroplating a substrate with a metallic material, particularly with copper, which comprises;

a bath of substantially rectangular parallelpiped shape and filled with electroplating solution, a substrate vertically held in the solution as a cathode plate and a pair of anode plates similarly held so as to put the substrate plate therebetween respectively with leaving a same distance, a bubble box mounted on the bath bottom wall fed with compressed air, and having two rows of nozzles formed in the upper wall thereof for releasing air bubbles to rise up in the bath solution along the both sides of the substrate so as to cause a pair of rising currents containing said air bubbles and said bath solution between the substrate and each of the anode plates, and means for guiding just released bubbles from the nozzles symmetrically between the substrate plate and each of the anode plates so as to cause said rising currents to be stable, said means including plate members mounted on the bubble box near the pair of nozzles.

2. The apparatus as set forth in claim 1, which further comprises;

a pair of passages for descending currents which is adapted to receive the bath solution overflowing the upper edges of the bath so as to stably guide the descending currents outside the bath to be introduced into the bath near the bath bottom to join respectively with the rising currents for forming a pair of stable solution circulations.

3. The apparatus as set forth in claim 2, in which each of said pair of passages is formed between the side wall of the bath and an outer side wall, the upper edges of the former being below the solution level but of the latter above thereof, and each of the bath side walls has an opening near the lower edge thereof so that descending current may be smoothly introduced therethrough into the bath to join with rising current.

4. The apparatus as set forth in claim 2, the bath has upper and lower vessels which are connected by a pair of passages, respectively in the form of conduits extended outside the bath, with each other so that bath solution overflowing the upper edges of the bath may be received by the upper vessel, guided to descend through said conduits to flow into the lower vessel, and introduced into the bath through an opening formed in the side walls of the bath near the bottom thereof to join with the respective rising currents.

5. The apparatus as set forth in claim 2, which further comprises a pair of upwardly protruded plate members respectively arranged near joining positions of the descending and rising currents so as to prevent just released bubbles from being disturbed by the currents, and near said plate members so as to more relevantly guide just released bubbles owing to the respective cooperation.

* * * * *